(12) United States Patent
Watarai

(10) Patent No.: US 6,967,505 B2
(45) Date of Patent: Nov. 22, 2005

(54) INPUT CIRCUIT

(75) Inventor: Seiichi Watarai, Tokyo (JP)

(73) Assignee: NEC Electronics Corporation, Kawasaki (JP)

( * ) Notice: Subject to any disclaimer, the term of this patent is extended or adjusted under 35 U.S.C. 154(b) by 0 days.

(21) Appl. No.: 10/697,267

(22) Filed: Oct. 31, 2003

(65) Prior Publication Data

US 2004/0090251 A1 May 13, 2004

Related U.S. Application Data

(62) Division of application No. 10/101,936, filed on Mar. 21, 2002, now Pat. No. 6,642,748.

(30) Foreign Application Priority Data

Mar. 26, 2001 (JP) ............................................ 2001/88408

(51) Int. Cl.[7] .............................................. G01R 15/00
(52) U.S. Cl. ............................ 327/55; 327/57; 327/212
(58) Field of Search ............................. 327/51, 52, 55, 327/57, 141, 142, 198, 210–215, 218, 219, 208, 159; 326/95–98; 365/203, 205, 808

(56) References Cited

U.S. PATENT DOCUMENTS

| | | | |
|---|---|---|---|
| 5,600,269 A | 2/1997 | Song et al. | 327/52 |
| 5,650,971 A * | 7/1997 | Longway et al. | 327/51 |
| 6,201,418 B1 | 3/2001 | Allmon | 327/52 |
| 6,204,698 B1 | 3/2001 | Zhang | 327/51 |
| 6,255,861 B1 | 7/2001 | Zhang | 327/51 |
| 6,331,791 B1 | 12/2001 | Huang | 326/98 |
| 6,486,719 B2 * | 11/2002 | Kim | 327/208 |

OTHER PUBLICATIONS

European Search Report dated Apr. 15, 2005.

* cited by examiner

*Primary Examiner*—Long Nguyen
(74) *Attorney, Agent, or Firm*—McGinn IP Law Group PLLC

(57) ABSTRACT

An input circuit includes a data input unit for receiving input data of the input circuit. A data latch unit latches output data of the input circuit. A reset unit resets the data latch unit in response to a first logic level of a first clock signal. A latch enhancement unit enhances the latching operation of the data latch unit in response to a first logic level of a second clock signal that is delayed in phase from the first clock signal. A clock synchronization unit transfers the input data from the input unit to the data latch unit in response to a second logic level of the first clock signal, the clock synchronization unit blocking a feedthrough current that flows through the reset unit, the data latch unit, and the latch enhancement unit when the first and second clock signals are in a first logic level state.

7 Claims, 6 Drawing Sheets

INPUT CIRCUIT

The present Application is a Divisional Application of U.S. patent application Ser. No. 10/101,936, filed on Mar. 21, 2002, now U.S. Pat. No. 6,642,748.

BACKGROUND OF THE INVENTION

1. Field of the Invention

The present invention relates to an input circuit, and more particular to an input circuit used for receiving signals exchanged among different semiconductor integrated circuits.

2. Description of the Prior Art

In general, this type of input circuit is used in transferring signals through bus lines or transmission cables interconnecting different integrated circuits. The input circuit receives signals and propagates the signal information to its own semiconductor integrated circuit. Therefore, without exception, every input circuit has a data input terminal for receiving signals from other integrated circuits and a data output terminal for propagating signal information to its own integrated circuit.

In recent years, as data transfer rate has been increased, it has come to be general that signals transferred among integrated circuits are low-amplitude signals on the order of 100 mV to 400 mV in spite that the power-source voltage of each integrated circuit is in the range of the order of 2 V to 5 V. Furthermore, in order to improve the reliability of logic signals, the differential-signal transmission system has come to be used instead of the single-ended signal transmission system that was the main system used formally. The differential-signal transmission system recognizes the difference of the amplitudes of two single-ended signals that are transferred simultaneously, thereby improving noise margins and reducing electromagnetic interference, and it is frequently used where fast and high-reliability processing is required.

Therefore, to support this type of transmission system, input circuits must provide functions of receiving differential signals and amplifying the voltages of low-amplitude data signals to voltages equal to or near the power-source voltages of their own integrated circuits.

Clock-triggered data processing methods, in which clock signals are used as triggers, are widely employed in integrated circuits to avoid loss of information due to data signal conflicts or time-varying factors in performing operations on the information propagated from the input circuits. A flip-flop circuit is known as a typical circuit of the clock-triggered type, which receives clock and data signals and temporarily stores the data in response to the transition timing of the clock signal.

FIG. 4 shows an exemplary data processing operation when the prior-art input circuit is connected to a flip-flop circuit.

Referring to FIG. 4, reference numeral 49 indicates an input circuit, and reference numeral 50 indicates a flip-flop circuit. Input data signal DIN input to the input circuit 49 is a low-amplitude signal, and data signal DOUT output from the input circuit 49 is generally a signal with an amplitude equal to the power-source voltage. The output terminal of the input circuit 49 is connected to the data input terminal D of the flip-flop circuit 50. The flip-flop circuit 50 is equipped with a clock terminal (CK), the data input terminal (D), and a data output terminal (Q). The clock terminal CK receives a clock signal CK, and the data input terminal receives a data signal DOUT.

In FIG. 4, the input circuit 49 amplifies the input data signal DIN from its low amplitude to an amplitude near the amplitude (on the order of 2 V to 5 V) of the power-source voltage of the integrated circuit, and provides the amplified input data signal to the data input terminal (D) of the flip-flop circuit 50, which is an internal circuit. As shown in FIG. 5, the flip-flop circuit 50 latches the data signal DOUT in response to the rising transition of the clock signal CK, stores it temporarily, and outputs an output signal Q, also in response to the clock transition. At this time, the relative timing relationship between the clock signal CK and data signal DOUT for enabling normal operations of the flip-flop circuit 50 must satisfy a minimum setup time requirement Tsu and hold time requirement Th, so the phase of the clock signal CK is adjusted to satisfy these requirements.

The example of prior art shown in FIG. 4, however, presents two major problems. One of the problems is that the signal amplitude amplification operation of the input circuit 49 lacks speed, so it cannot support fast transmission rates, such as rates of several gigabits per second (Gbps). The other problem is that the input circuit 49 and the flip-flop circuit 50 are configured separately, so it is impossible to keep the delay time of the data signal DOUT of the input circuit 49 constant with respect to the clock signal CK in the process of supplying the output signal DOUT to the flip-flop circuit 50, making it difficult to keep the setup time Tsu and hold time Th within the range enabling normal operations of the flip-flop circuit 50.

FIG. 6 shows a prior-art input circuit that has been devised to solve these problems.

Referring to FIG. 6, reference numerals 1 to 4 indicate PMOS transistors, and reference numerals 5 to 11 indicate NMOS transistors. The source of the PMOS transistor 1 is connected to the power source (VDD), and the drain of the PMOS transistor 1 is connected to the drain of the NMOS transistor 5. Given that the source of the NMOS transistor 5 is kept at the ground potential, the PMOS transistor 1 and NMOS transistor 5 form a CMOS inverter having a noninverting output terminal Z and an inverting output terminal ZB as its input and output nodes, respectively. On the other hand, given that the source of the NMOS transistor 6 is kept at the ground potential, the PMOS transistor 2 and the NMOS transistor 5 form a CMOS inverter having an inverting output terminal ZB and a noninverting output terminal Z as its input and output nodes. This cross-couples the input and output nodes of the CMOS inverter consisting of the PMOS transistor 1 and NMOS transistor 5 with the input and output nodes of an CMOS inverter consisting of the PMOS transistor 2 and NMOS transistor 6, thereby forming a flip-flop circuit.

The source of a PMOS transistor 3 is connected to the power source (VDD); its drain is connected in common to the gates of both the PMOS transistor 1 and NMOS transistor 5; and its gate receives a clock signal CK1. The gates of the PMOS transistor 1 and NMOS transistor 5 and the drain of the PMOS transistor 3 are connected to the noninverting output terminal Z. The source of the PMOS transistor 4 is connected to the power source (VDD); its drain is connected in common to the gates of the PMOS transistor 2 and NMOS transistor 6; and its gate receives a clock signal CK1. The gates of both the PMOS transistor 2 and NMOS transistor 6 and the drain of the PMOS transistor 4 are connected to the inverting output terminal ZB.

The drains of the NMOS transistors 7 and 8 are connected to the sources of the NMOS transistors 5 and 6 mentioned above, respectively, and the sources of the NMOS transistors 7 and 8 are connected to ground (GND) through the NMOS transistor 9. The gates of the NMOS transistors 7 and 8 are connected to the noninverting data terminal D and inverting data terminal DB, respectively, and the gate of the NMOS transistor 9 receives a clock signal CK1. The drain of the NMOS transistor 10 is connected to the source of the NMOS transistor 5 and the drain of the NMOS transistor 7, and its source is connected to ground (GND). In contrast, the drain of the NMOS transistor 11 is connected to the source of the NMOS transistor 6 and the drain of the NMOS transistor 8, and the source of the NMOS transistor 11 is connected to ground (GND). The gates of NMOS transistors and 11 receive a clock signal CK2.

Next, the operation of the flip-flop circuit shown in FIG. 6 will be described.

Referring to the timing diagram shown in FIG. 7, at time t=0, clock signal CK1 is at the low logic level while the noninverting output terminal Z and inverting output terminal ZB are at the high logic level. Next, when clock signal CK1 changes from low to high at time t=1, the input circuit temporarily retains the data signal D0 received at the noninverting data terminal D and outputs the data signal D0 from the noninverting output terminal Z. Subsequently, when the clock signal CK1 changes from high to low at time t=2, the noninverting output terminal Z and inverting output terminal ZB output a high again. Subsequent operations after t=2 are similar to the operations mentioned above, as shown in FIG. 7. The state in which the low of a clock signal CK1 brings both the noninverting output terminal Z and inverting output terminal ZB high is called a reset state.

The sequence of input circuit operations above will now be described further in detail with reference to FIG. 7.

First, at time t=0, since clock signal CK1 is at the low logic level, the PMOS transistors 3 and 4 are in the conducting state, and the NMOS transistor 9 is in the nonconducting state. Therefore, the signals on both the noninverting output terminal Z and inverting output terminal ZB go high, and the potential at this time becomes the same as that of the power source (VDD), that is, the circuit is in the so-called reset state.

Next, when the clock signal CK1 changes from low to high at time t=1, the PMOS transistors 3 and 4 are switched to the nonconducting state, and the NMOS transistor 9 is switched to the conducting state. At this time, if a data signal D0 that appears at the noninverting data terminal D is high and a data signal D0B that appears at the inverting data terminal DB is low, the NMOS transistor 7 is in the conducting state and the NMOS transistor 8 is in the nonconducting state. Therefore, the source of the NMOS transistor 5 is clamped to a potential equal to the ground (GND) potential because the NMOS transistors 7 and 9 are in the conducting state. Accordingly, the NMOS transistor 5 is also in the conducting state, and the inverting output terminal ZB goes low. The potential at this time is the same as the ground (GND) potential. This also switches the PMOS transistor 2 to the conducting state, clamping the noninverting output terminal Z to high, or the power-source (VDD) potential level. In this case, since the operation was reset at time t=0, the logic level of the noninverting output terminal Z remains unchanged, or high.

Clock signal CK2 changes with a fixed delay with respect to clock signal CK1. The clock signal CK2 changes from low to high and the NMOS transistors 10 and 11 transit from the nonconducting state to the conducting state, thereby clamping the sources of the NMOS transistors 5 and 6 to the ground (GND) potential level. This enables faster nonconducting-to-conducting state transition of the NMOS transistor 5 and PMOS transistor 2, hence faster operation.

Furthermore, when the clock signal CK1 changes from high to low at time t=2, the PMOS transistors 3 and 4 are switched again to the conducting state and the NMOS transistor 9 is switched to the nonconducting state. Therefore, both signals that appear on the noninverting output terminal Z and inverting output terminal ZB go high. A potential at this time is the same as the power-source (VDD) potential, and the operation returns to the reset state. Similar operations continue after time t=2, although when the clock signal CK1 changes from low to high, the conducting and nonconducting states of respective pairs of the PMOS transistors 1 and 2, the NMOS transistors 5 and 6, and the NMOS transistors 7 and 8 may be reversed depending on the variations in the logic of the signals received at the noninverting data terminal D and inverting data terminal DB.

For example, at time t=3, when the clock signal CK1 changes from low to high again, a data signal D1 received at the noninverting data terminal D is low, and a data signal D1B received at the inverting data terminal DB is high, the NMOS transistor 8 is accordingly in the conducting state and the NMOS transistor 7 is in the nonconducting state in contrast to the case of t=1. Therefore, the source of the NMOS transistor 6 is clamped to the ground (GND) potential because the NMOS transistors 8 and 9 are in the conducting state. This also switches the NMOS transistor 6 to the conducting state, and a signal that appears at the noninverting output terminal Z also goes low. At the same time, the PMOS transistor 3 is also switched to the conducting state, clamping the inverting output terminal ZB to high, or the power-source (VDD) potential level. In this case, since the reset state was retained at t=2, the logic of the signal appearing at the inverting output terminal ZB remains unchanged, or high.

The conventional latch-type input circuit shown in FIG. 6, however, presents a problem in that, especially when clock signals CK1 and CK2 change from high to low and signals at the noninverting output terminal Z and inverting output terminal ZB go high, or in the reset state, the amount of current flowing from the power source (VDD) is large, requiring large switching power. The reason for this will be described with reference to FIG. 7.

Referring to FIG. 6, the state transition from time t=1 to time t=2 described above will be taken as an example again. More specifically, it is assumed that, at time t=1, clock signal CK1 is at the high logic level, data signal D0 is at the high logic level, and data signal D0B is at the low logic level. At this time, the NMOS transistors 7, 6, and 9, the PMOS transistor 1, and the NMOS transistors 10 and 11 are in the conducting state, and the PMOS transistors 3, 4, and 2, and NMOS transistor 8 are in the nonconducting state.

This causes the noninverting output terminal Z to output a low, or a signal at the ground (GND) potential level, and the inverting output terminal ZB to output a high, or a signal at the power-source (VDD) potential level. At this time, since the NMOS transistor 6 is in the conducting state, the source and drain terminals of the NMOS transistor 6 and the drain terminal of NMOS transistor 8 are low, or at the ground (GND) potential level. When the clock signal CK2 changes from low to high, the NMOS transistors 10 and 11 are switched to the conducting state, thereby enabling faster nonconducting-to-conducting state transitions of the MOS transistors mentioned above.

Subsequently, while the clock signal CK1 changes from high to low at time t=2 and the clock signal CK2 changes from high to low at time t=2' with a fixed delay with respect to the clock signal CK1, the PMOS transistors 3 and 4 are switched to the conducting state again, while the NMOS transistors 6 and are in the conducting state, whereby a feedthrough current route from the power source (VDD) through the PMOS transistor 3, NMOS transistor 6, and NMOS transistor 11 to ground (GND) is formed. This causes feedthrough current to flow from the power source (VDD) to ground (GND), resulting in increased power consumption.

Furthermore, when the clock signal CK1 changes from high to low at time t=2 and the PMOS transistors 3 and 4 are switched to the conducting state again, the NMOS transistor 6 is switched to the conducting state. This causes the potentials of the source and drain terminals of the NMOS transistor 6 and the drain terminal of the NMOS transistor 8 to change from the ground (GND) potential to a potential near the power-source (VDD) potential. The source and drain of the NMOS transistor 6 have a large amount of parasitic capacitance, including diffusion layer capacitance of all the MOS transistors connected thereto and the capacitance of metal wiring interconnecting the MOS transistors. Therefore, a large amount of charge current for charging the parasitic capacitance flows from the power source (VDD) through the conducting elements of the PMOS transistor 3 and NMOS transistor 6, resulting in an increase in the switching power.

BRIEF SUMMARY OF THE INVENTION

Object of the Invention

The object of the invention is to provide an input circuit capable of higher-speed operation with lower power consumption.

SUMMARY OF THE INVENTION

An input circuit of the present invention has a data input means for the input of input data; a data latch means for latching the input data; a reset means for resetting the data latch means; a clock synchronization means for synchronizing the input of the input data to the data input means; and a latch enhancement means for blocking feedthrough current by functioning complementarily to the reset means and enhancing the latching operation of the data latch means.

BRIEF DESCRIPTION OF THE DRAWINGS

The above-mentioned and other objects, features and advantages of this invention will become more apparent by reference to the following detailed description of the invention taken in conjunction with the accompanying drawings, wherein.

DETAILED DESCRIPTION OF THE INVENTION

A first embodiment of the present invention will be described with reference to the circuit diagram shown in FIG. 1.

Figure 1:
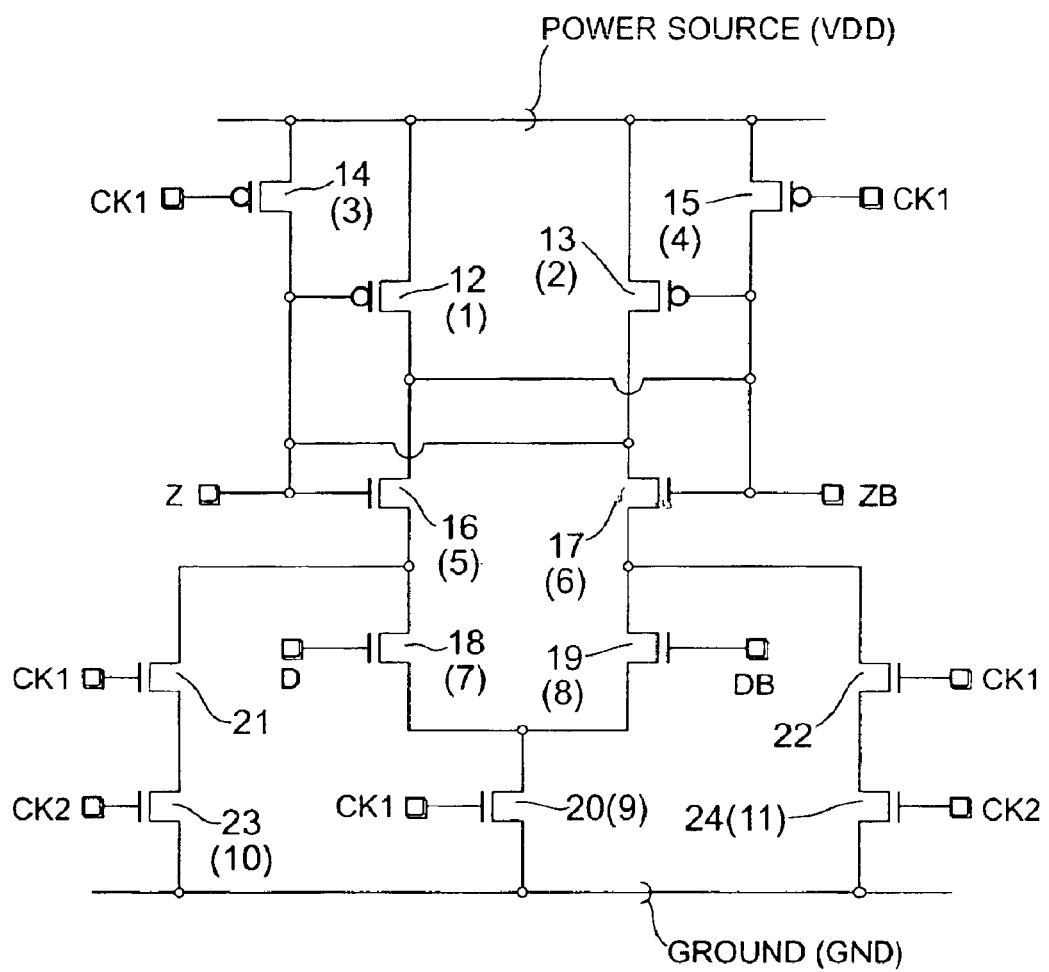
FIG. 1 is a circuit diagram showing the configuration of an input circuit according to a first embodiment of the present invention.
Figure 6:
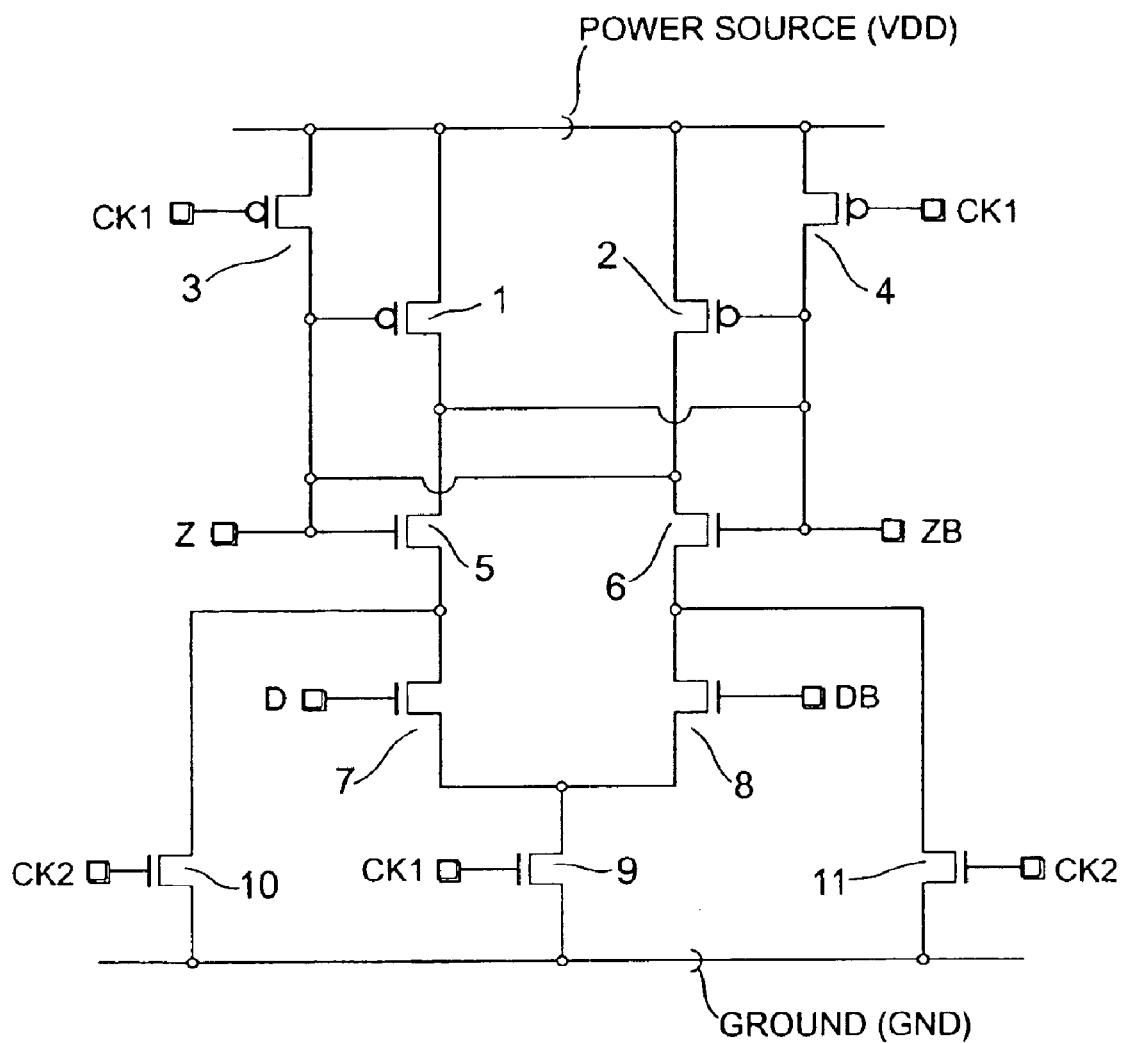
FIG. 6 is a circuit diagram showing the configuration of an input circuit according to a second prior art.

Referring to FIG. 1, reference numerals 12, 13, 14, and 15 indicate PMOS transistors corresponding to the PMOS transistors 1, 2, 3, and 4 shown in FIG. 6, respectively. In FIG. 1, reference numerals 16, 17, 18, 19, 20, 23, and 24 indicate NMOS transistors corresponding to the NMOS transistors 5, 6, 7, 8, 9, 10, and 11 shown in FIG. 6, respectively. Referring to FIG. 1, reference numerals 21 and 22 indicate NMOS transistors that function as a feedthrough-current blocking means in combination, which are not included in the configuration shown in FIG. 6.

The NMOS transistor 21 is connected to the NMOS transistor 23 in series. More specifically, the drain of the NMOS transistor 21 is connected to the source of the NMOS transistor 16 and the drain of the NMOS transistor 18; and the source of the NMOS transistor 21 is connected to the drain of the NMOS transistor 23. On the other hand, the NMOS transistor 22 is connected to the NMOS transistor 24 in series. More specifically, the drain of the NMOS transistor 22 is connected to the source of the NMOS transistor 17 and the drain of the NMOS transistor 19; and the source of the NMOS transistor 22 is connected to the drain of the NMOS transistor 24. The other structural features are the same as those shown in FIG. 6.

The NMOS transistors 18 and 19 constitute a data input means for the input of input data; and the PMOS transistors 12 and 13 and the NMOS transistors 16 and 17 constitute a data latch means for latching the input data. The PMOS transistors 14 and constitute a reset means for resetting the data latch means; and the NMOS transistor 20 constitutes a clock synchronization means for synchronizing the input of input data to the data input means. The NMOS transistors 21 to 24 constitute a latch enhancement means for blocking feedthrough current by functioning complementarily to the reset means, and enhancing the latching operation of the data latch means. Among the NMOS transistor 21 to 24, the NMOS transistors 21 and 22 constitute a feedthrough-current blocking means described later.

Next, the configuration of each of the aforementioned means will be described specifically.

The data latch means is configured as follows.

The sources of both the PMOS transistor 12 (a first PMOS transistor) and PMOS transistor 13 (a second PMOS transistor) are connected to a power source (VDD) (a first power source) The drains of the PMOS transistor 12 and NMOS transistor 16 (a first NMOS transistor) and the gates of the PMOS transistor 13 and NMOS transistor 17 (a second NMOS transistor) are connected to an inverting output terminal ZB (a second output terminal). The drains of the PMOS transistor 13 and NMOS transistor 17 and the gates of the PMOS transistor 12 and NMOS transistor 16 are connected to a noninverting output terminal Z (a first output terminal); and the source of the NMOS transistor 16 is connected to a common terminal (a first common terminal) at which one of a pair of complementary signals constituting input data appears. The source of the NMOS transistor 17 is connected to a common terminal (a second common terminal) at which the other one of the pair of complementary signals constituting the input data appears.

The reset means is configured as follows.

The sources of the PMOS transistor 14 (a third PMOS transistor) and PMOS transistor 15 (a fourth PMOS transistor) are connected the power source (VDD). The drain of the PMOS transistor 14 is connected to the noninverting output terminal Z, and the drain of the PMOS transistor 15 is connected to the inverting output terminal ZB. The gates of the PMOS transistors 14 and 15 are connected to clock input terminals (a first clock input terminal) that receive a clock signal CK1.

The data input means is configured as follows.

The gate of the NMOS transistor 18 is connected to a data input terminal D (a first data input terminal), and the gate of the NMOS transistor 19 is connected to a data input terminal DB (a second data input terminal). The drain of the NMOS transistor 18 is connected to the first common terminal, and the drain of the NMOS transistor 19 is connected to the second common terminal. The sources of the NMOS transistors 18 and 19 are connected to a third common terminal to which a ground (GND) (a second power source) potential is supplied.

The clock synchronization means is configured as follows.

The gate of the NMOS transistor 20 (a fifth NMOS transistor) is connected to the clock input terminal that receives the clock signal CK1; the drain of the NMOS transistor 20 is connected to the third common terminal; and the source of the NMOS transistor is connected to ground (GND) (the second power source).

The latch enhancement means is configured as follows.

The gates of the NMOS transistor 23 (a sixth NMOS transistor) and NMOS transistor 24 (a seventh NMOS transistor) are connected to the second clock input terminal, the sources of the NMOS transistor 21 (a eighth NMOS transistor) and NMOS transistor 22 (a ninth NMOS transistor) are connected to ground (GND) (the second power source). The drain of the NMOS transistor 23 is connected to the output end of the current path of the NMOS transistor 21 forming a first feedthrough-current blocking means, and the drain of the NMOS transistor 24 is connected to the output end of the current path of the NMOS transistor 22 forming a second feedthrough-current blocking means. The input end of the current path of the first feedthrough-current blocking means is connected to the first common terminal (the drain of the NMOS transistor 16); the input end of the current path of the second feedthrough-current blocking means is connected to the second common terminal (the drain of the NMOS transistor 17); and the control terminals (the gates of the eighth and ninth NMOS transistors 21 and 22) of the first and second feedthrough-current blocking means are connected to the first clock input terminal.

The first and second feedthrough-current blocking means are configured as follows.

The gates of the NMOS transistors 21 (the eighth NMOS transistor) and 22 (the ninth NMOS transistor) are connected to the first clock input terminals. The drain of the NMOS transistor 21 is connected to the first common terminal, and the drain of the NMOS transistor 22 is connected to the second common terminal. The source of the NMOS transistor 21 is connected to the drain of the NMOS transistor 23, and the source of the NMOS transistor 24 is connected to the drain of the NMOS transistor 22.

The first embodiment shown in FIG. 1 includes the NMOS transistors 21 and 22 as the feedthrough-current blocking means, thereby providing a function of blocking feedthrough current presenting a problem in the prior-art circuit shown in FIG. 6. The function is referred to as the feedthrough-current blocking function below. The feed through-current blocking function will now be described with reference to the timing diagram shown in FIG. 7.

Figure 7:
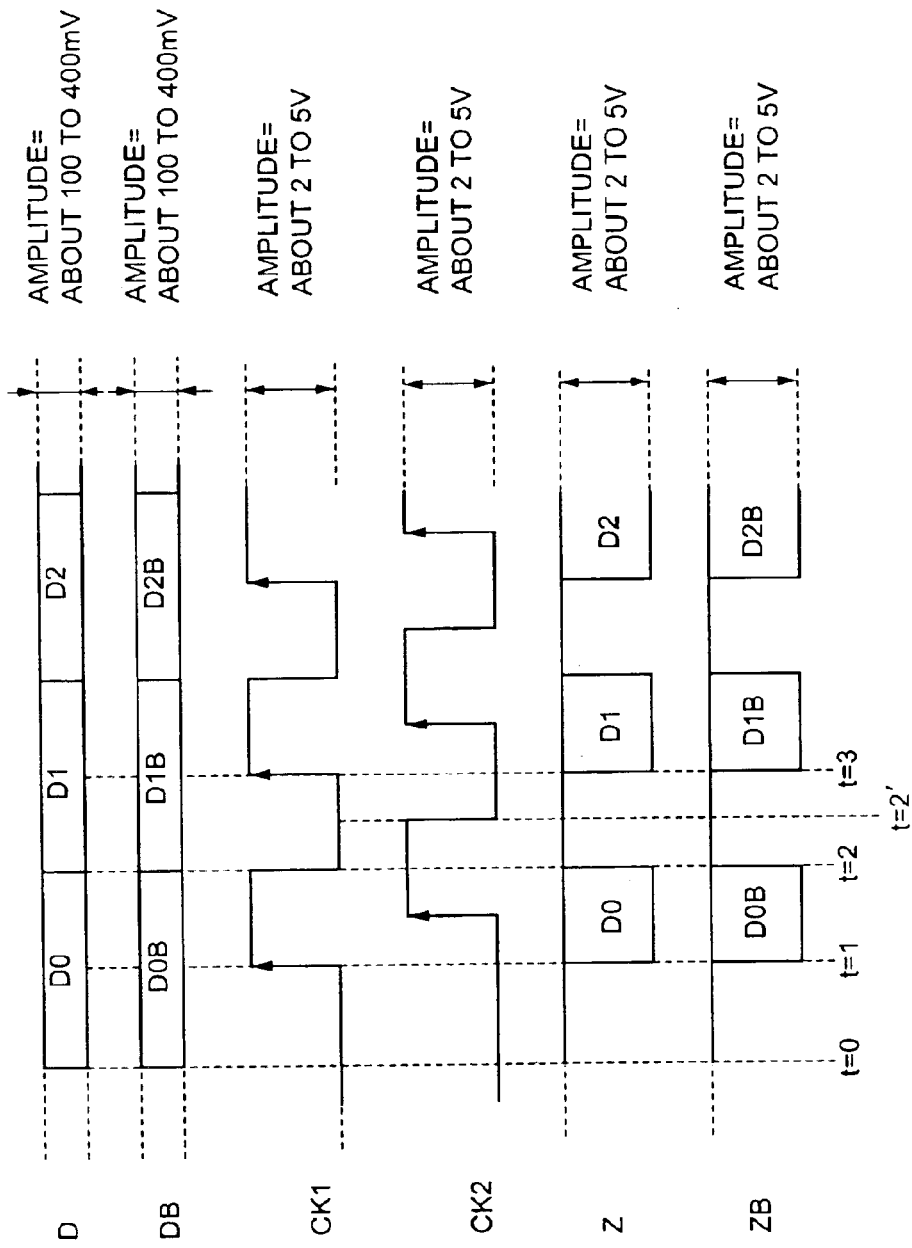
FIG. 7 is a timing waveform diagram for illustrating the operation of the input circuits of the present invention and the second prior art shown in FIG. 6.

Referring to FIG. 7, the transition from the state at time t=1 to the state at time t=2 will be taken as an example. More specifically, it is assumed that, at time t=1, a clock signal CK1 is at the high logic level, a data signal D0 is at the high logic level, and a data signal D0B is at the low logic level. At this time, the NMOS transistor 18, NMOS transistor 17, NMOS transistor 20, PMOS transistor 12, and NMOS transistors 21 to 24 are in the conducting state; and the PMOS transistors 14 and 15, the PMOS transistor 13, and the NMOS transistor 19 are in the nonconducting state.

This causes the noninverting output terminal Z to output a low, or a signal at the ground (GND) potential level, and the inverting output terminal ZB to output a high, or a signal at the power-source (VDD) potential level. At this time, the source and drain terminals of the NMOS transistor 17 and the drain terminal of the NMOS transistor 19 are low, or at the ground (GND) potential level, because the NMOS transistor 17 is in the conducting state. The clock signal CK2 changes from low to high, while the NMOS transistors 23 and 24 are in the conducting state, thereby achieving faster nonconducting-to-conducting state transition of the MOS transistors mentioned above.

Subsequently, while the clock signal CK1 changes from high to low at time t=2 and the clock signal CK2 changes from high to low with a fixed delay with respect to the clock signal CK1 at time t=2', the PMOS transistors 14 and 15 are switched to the conducting state again, and simultaneously, the NMOS transistors 21 and 22 are switched to the non-conducting state, thereby blocking a current route from the power source (VDD) through the PMOS transistor 14, NMOS transistor 17, NMOS transistor 22, and NMOS transistor 24 to ground (GND). This completely blocks feedthrough current from the power source (VDD) to ground (GND), thereby making it possible to prevent an increase in power consumption.

Next, a second embodiment according to the present invention will be described with reference to the circuit diagram shown in FIG. 2.

Figure 2:
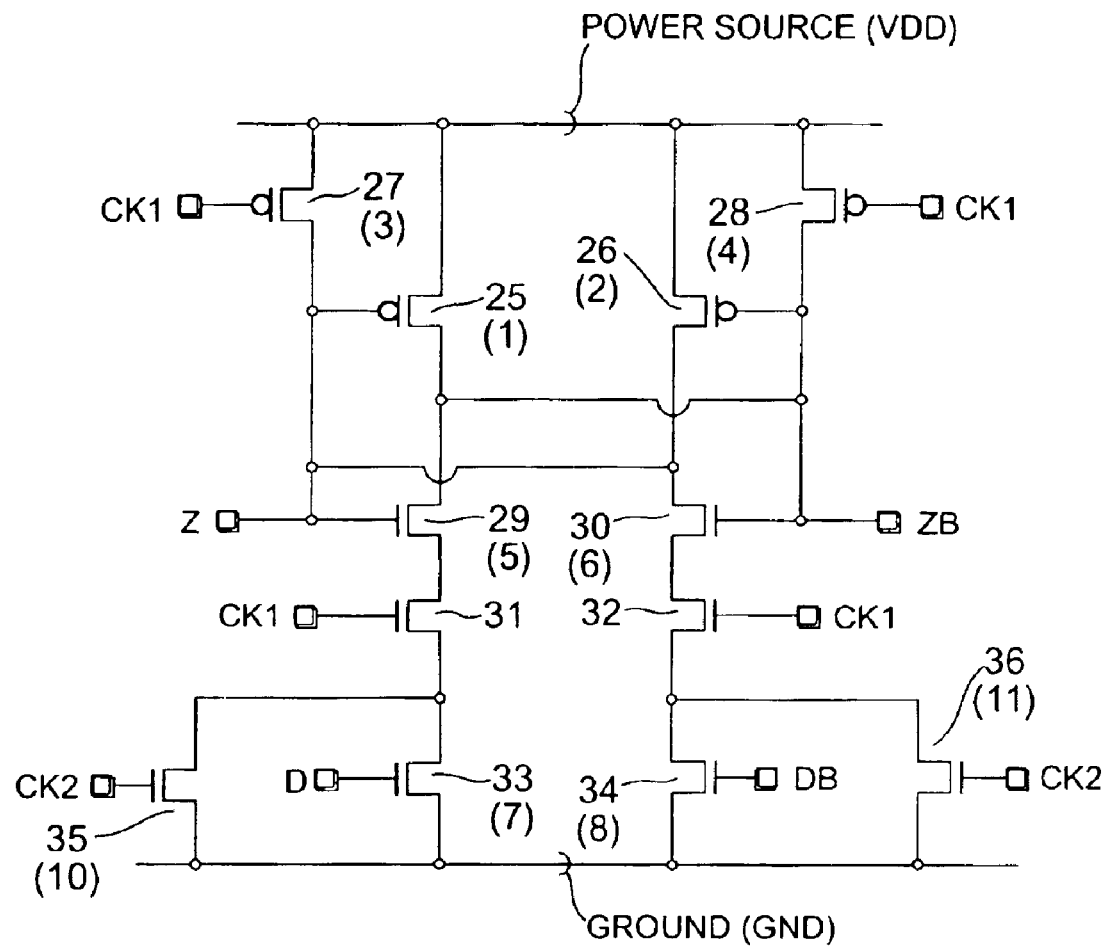
FIG. 2 is a circuit diagram showing the configuration of an input circuit according to a second embodiment of the present invention.

In FIG. 2, components identical to those in the first embodiment are indicated by reference numerals identical to those shown in FIG. 1 in parentheses.

Referring to FIG. 2, reference numerals 25, 26, 27, and 28 indicate PMOS transistors corresponding to the PMOS transistors 1, 2, 3, and 4 shown in FIG. 6, respectively. In FIG. 2, reference numerals 29, 30, 33, 34, 35, and 36 indicate NMOS transistors corresponding to the NMOS transistors 5, 6, 7, 8, 10, and 11 shown in FIG. 6, respectively. In FIG. 2, reference numerals 31 and 32 indicate NMOS transistors that provide a combined function of a feedthrough-current blocking means and a clock synchronization means, which are not included in the configuration shown in FIG. 6.

The drain of the NMOS transistor 31 is connected to the source of the NMOS transistor 29, and its source is connected to the drains of the NMOS transistors 33 and 35. On the other hand, the drain of the NMOS transistor 32 is connected to the source of the NMOS transistor 30, and its source is connected to the drains of the NMOS transistors 34 and 36. The NMOS transistors 31 and 32 function as the NMOS transistor 9 shown in FIG. 6, and the second embodiment directly connects the sources of the NMOS transistors 33 and 34 to ground (GND).

The NMOS transistors 33 and 34 constitute a data input means for the input of input data, and the PMOS transistors 25 and 26 and the NMOS transistors 29 and 30 constitute a data latch means for latching the input data. The PMOS transistors 27 and 28 constitute a reset means for resetting the data latch means, and the NMOS transistors 31 and 32 constitute a clock synchronization means for synchronizing the input of the input data to the data input means. The NMOS transistors 31 and 32 also provide a function for blocking feedthrough current by functioning complementarily to the reset means, or a feedthrough-current blocking means described later. The NMOS transistors 35 and 36 constitute a latch enhancement means for enhancing the data latch means.

Next, the configuration of each of the aforementioned means will be described specifically.

The data input means is configured as follows.

The sources of the NMOS transistor 33 (a tenth NMOS transistor) and NMOS transistor 34 (an eleventh NMOS transistor) are connected to ground (GND) (a second power source), the gate of the NMOS transistor 33 is connected to a data input terminal D (a first data input terminal), and the gate of the NMOS transistor 34 is connected to a data input terminal DB (a second data input terminal). The drain of the NMOS transistor 33 is connected to a third common terminal (no reference numeral assigned) at which one of a pair of complementary signals constituting input data appears, and the drain of the NMOS transistor 34 is connected to a fourth common terminal (no reference numeral assigned) at which the other one of the pair of complementary signals constituting input data appears.

The clock synchronization means is configured as follows.

The gates of the NMOS transistor 31 (a twelfth NMOS transistor) and NMOS transistor 32 (a thirteenth NMOS transistor) are connected to the first clock input terminal. The source of the NMOS transistor 31 is connected to the third common terminal (no reference numeral assigned) at which one of a pair of complementary signals constituting input data appears; and the source of the NMOS transistor 32 is connected to the fourth common terminal (no reference numeral assigned) at which the other one of the pair of complementary signals constituting the input data appears. The drain of the NMOS transistor 31 is connected to a first common terminal (the source of the NMOS transistor 29); and the drain of the NMOS transistor 32 is connected to a second common terminal (the source of the NMOS transistor 30).

The latch enhancement means is configured as follows.

The sources of the NMOS transistor 35 (a fourteenth NMOS transistor) and NMOS transistor 36 (a fifteenth NMOS transistor) are connected to ground (GND) (the second power source); and the gates of the NMOS transistor 35 and NMOS transistor 36 are connected to a second clock input terminal. The drain of the NMOS transistor 35 is connected to the third common terminal (the drain of the NMOS transistor 33) at which one of a pair of complementary signals constituting input data appears; and the drain of the NMOS transistor 36 is connected to the fourth common terminal (the drain of the NMOS transistor 34) at which the other one of the pair of complementary signals constituting the input data appears.

The second embodiment shown in FIG. 2 includes the NMOS transistors 31 and 32 that provide a combined function of a feedthrough-current blocking means and a clock synchronization means, thereby blocking both feedthrough current and charge current causing the aforementioned problems in the prior-art circuit shown in FIG. 6. The function is referred to as a feedthrough and charge current blocking function below. The feedthrough and charge current blocking function will now be described with reference to the timing diagram shown in FIG. 7.

Referring to FIG. 7, the transition from the state at time t=1 to the state at time t=2 will be taken as an example. More specifically, it is assumed that, at time t=1, a clock signal CK1 at the high logic level, a data signal D0 is at the high logic level, and a data signal D0B is at the low logic level. At this time, the NMOS transistors 30 to 32, PMOS transistor 25, and NMOS transistors 35 and 36 are in the conducting state; and the PMOS transistors 27 and 28, and PMOS transistor 26 are in the nonconducting state.

In response to the logic level of a data signal, the NMOS transistor 33 is in the heavy conducting state and the NMOS transistor 34 is in the light conducting state. This causes the noninverting output terminal Z to output a low, or a signal at the ground (GND) potential level; and the inverting output terminal ZB to output a high, or a signal at the power-source (VDD) potential level. At this time, the source and drain terminals of the NMOS transistors 30, 32 and the drain terminals of the NMOS transistors 33 and 34 are low, or at the ground (GND) potential level. The clock signal CK2 changes from low to high, and the NMOS transistors 35 and 36 are in the conducting state, thereby achieving faster nonconducting-to-conducting state transition of the MOS transistors mentioned above.

Subsequently, while the clock signal CK1 changes from high to low at time t=2 and the clock signal CK2 changes from high to low with a fixed delay with respect to the clock signal CK1 at time t=2', the PMOS transistors 27 and 28 are switched to the conducting state again, and simultaneously, the NMOS transistors 31 and 32 are switched to the nonconducting state, thereby blocking a current route from the power source (VDD) through the PMOS transistor 27 and the NMOS transistors 30, 32, and 36 to ground (GND). This completely blocks feedthrough current flowing from the power source (VDD) to ground (GND), making it possible to prevent an increase in power consumption.

At this time, the node of the source of the NMOS transistor 32, the drain of the NMOS transistor 34, and the drain of the NMOS transistor 36 is blocked from the node of the drain of the NMOS transistor 32 and the source of the NMOS transistor 30. Therefore, charge current for increasing the potential of the node of the source of the NMOS transistor 32 and the drains of the NMOS transistors 34 and 36 from the ground (GND) potential to a potential near the power-source (VDD) potential becomes unnecessary, resulting in reduced switching current.

Next, a third embodiment according to the present invention will be described with reference to the circuit diagram shown in FIG. 3.

Figure 3:
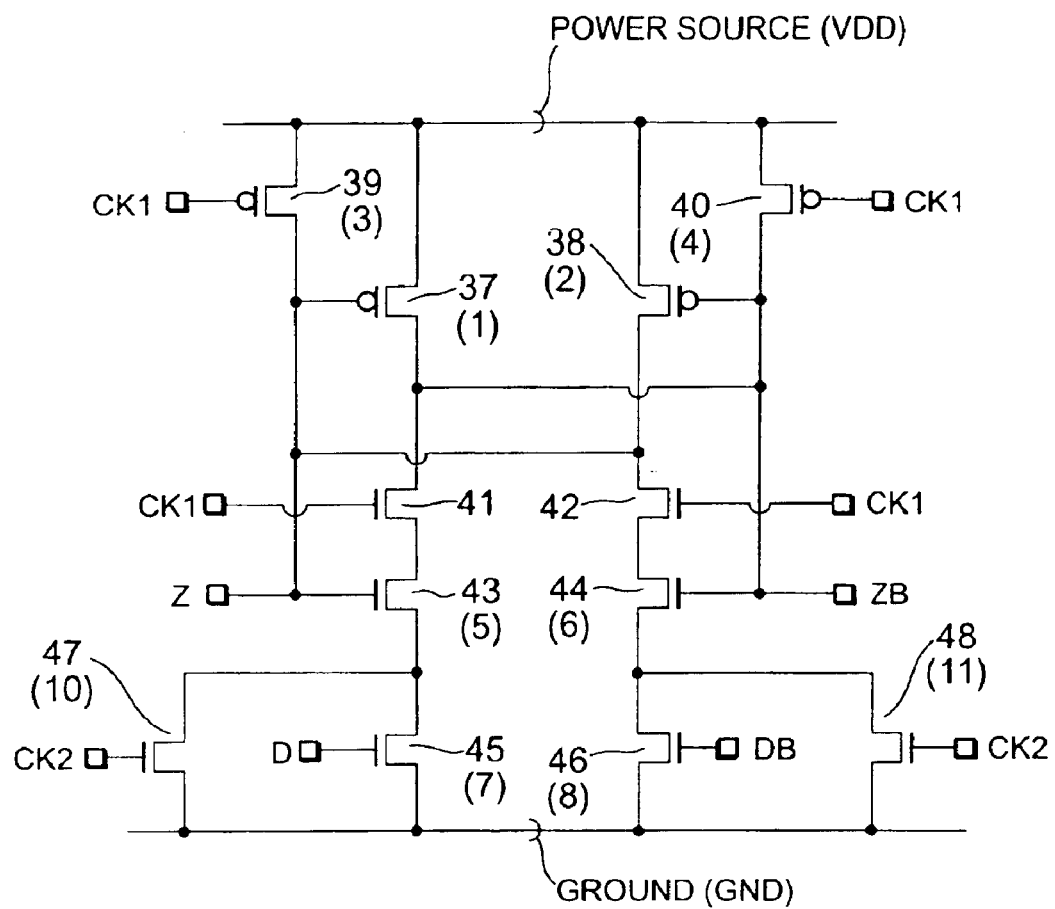
FIG. 3 is a circuit diagram showing the configuration of an input circuit according to a third embodiment of the present invention.
Figure 4:
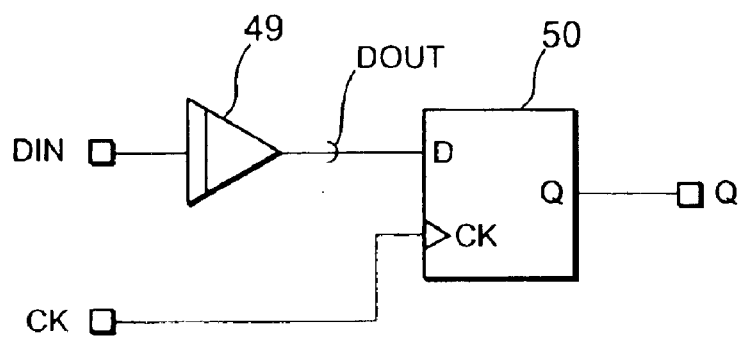
FIG. 4 is a circuit diagram showing the configuration of an input circuit according to a first prior art.
Figure 5:
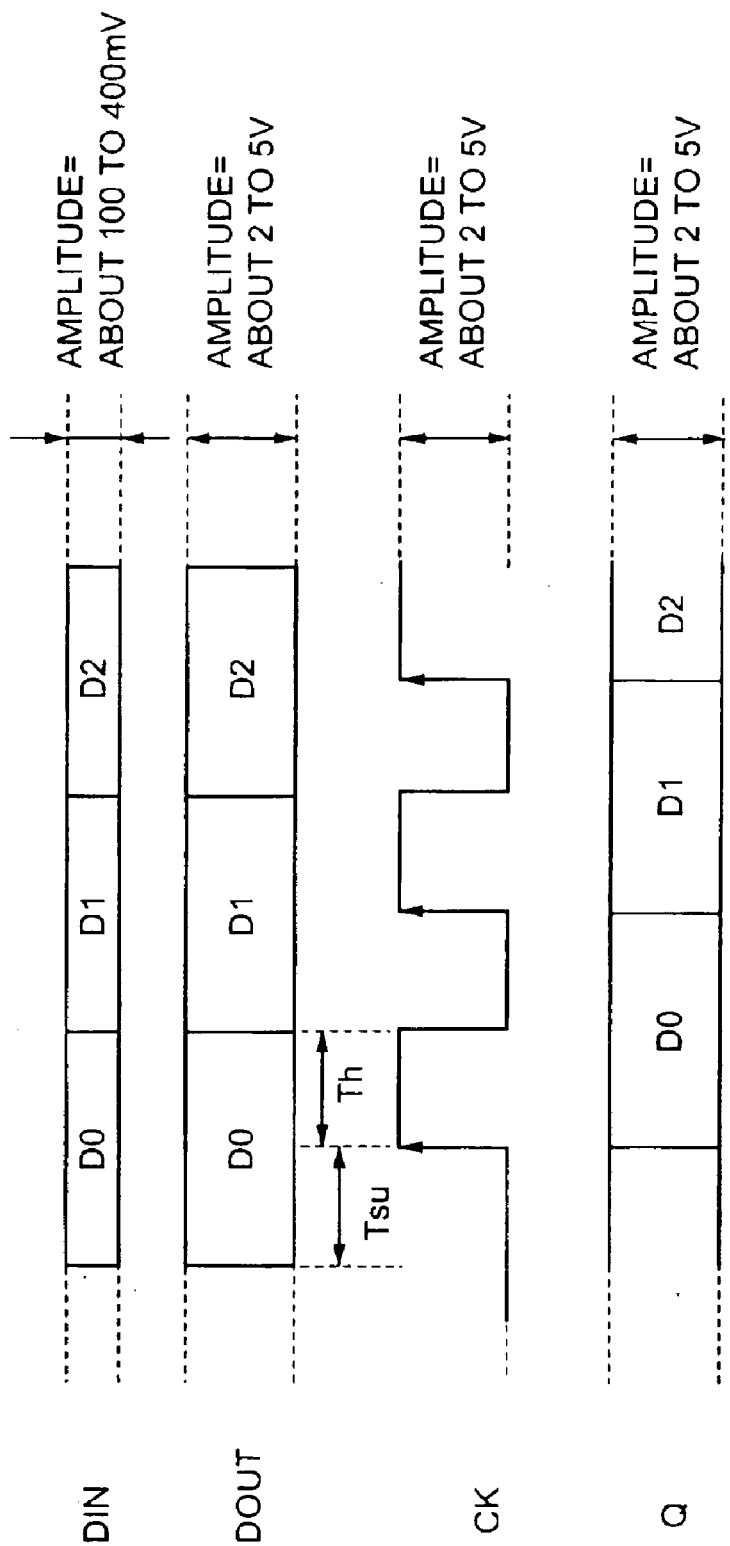
FIG. 5 is a timing waveform diagram showing the operation of the circuit shown in FIG. 4.

In FIG. 3, components identical to those in the first embodiment are indicated by reference numerals identical to those shown in FIG. 1 in parentheses.

Referring to FIG. 3, reference numerals 37, 38, 39, and 40 indicate PMOS transistors corresponding to the PMOS transistors 1, 2, 3, and 4 shown in FIG. 6, respectively. In FIG. 3, reference numerals 43, 44, 45, 46, 47, and 48 indicate NMOS transistors corresponding to the NMOS transistors 5, 6, 7, 8, 10, and 11 shown in FIG. 6, respectively. In FIG. 3, reference numerals 41 and 42 indicate NMOS transistors that function in combination as a feedthrough-current blocking means and a clock synchronization means, which are not included in the configuration shown in FIG. 6 and correspond to the NMOS transistors 31 and 32 shown in FIG. 2, respectively. The circuit configuration according to the third embodiment differs from the circuit configuration according to the second embodiment described above in that the positional relationship between the NMOS transistors 41 and 42 and the NMOS transistors 43 and 44 is the reverse of the positional relationship between the NMOS transistors 29 and 30 and the NMOS transistors 31 and 32. Other structural features are the same as those in the second embodiment.

The drain of the NMOS transistor 41 is connected to the drain of the PMOS transistor 37, and the gate of the NMOS transistor 41 receives clock signal CK1. The drain of the NMOS transistor 43 is connected to the source of the NMOS transistor 41, and its gate is connected to the noninverting output terminal D. The source of the NMOS transistor 43 is connected to the drains of the NMOS transistors 45 and 47. On the other hand, the drain of the NMOS transistor 42 is connected to the drain of the PMOS transistor 38, and the gate of the NMOS transistor 42 receives a clock signal CK1. The drain of the NMOS transistor 44 is connected to the source of the NMOS transistor 42, and its gate is connected to the noninverting output terminal D. The source of the NMOS transistor 44 is connected to the drains of the NMOS transistors 46 and 48.

The NMOS transistors 45 and 46 constitute a data input means for the input of input data, and the PMOS transistors 37 and 38 and the NMOS transistors 41 to 44 constitute a data latch means that provides a combined function of blocking feedthrough current in the reset state and synchronizing the latch of the input data. The PMOS transistors 39 and 40 constitute a reset means for resetting the data latch means, and the NMOS transistors 47 and 48 constitute a latch enhancement means for enhancing the latching operation of the data latch means.

The circuit configuration of the third embodiment shown in FIG. 3 includes the NMOS transistors 41 and 42 that provide a combined function of a feedthrough-current blocking means and a clock synchronization means in the data latch means consisting of the PMOS transistors 37 and 38 and the NMOS transistors 43 and 44, thereby blocking both feedthrough current and charge current causing the problems in the prior-art circuit shown in FIG. 6. The third embodiment, however, provides a charge-current blocking function superior to that provided by the second embodiment. The charge-current blocking function will now be described with reference to the timing diagram shown in FIG. 7.

Referring to FIG. 7, the transition from the state at time t=1 to the state at time t=2 will be taken as an example. More specifically, it is assumed that, at time t=1, a clock signal CK1 at the high logic level, a data signal D0 is at the high logic level, and a data signal D0B is at the low logic level. At this time, the NMOS transistor 44, 41, and 42, the PMOS transistor 37, and the NMOS transistors 47 and 48 are in the conducting state; and the PMOS transistors 39 and 40, and the PMOS transistor 38 are in the nonconducting state. In response to the logic level of a data signal, the NMOS transistor 45 is in the heavy conducting state and the NMOS transistor 46 is in the light conducting state. This causes the noninverting output terminal Z to output a low, or a signal at the ground (GND) potential level; and the inverting output terminal ZB to output a high, or a signal at the power-source (VDD) potential level. At this time, the source and drain terminals of the NMOS transistor 42 and 44, and the drain terminals of the NMOS transistors 46 and 48 are low, or at the ground (GND) potential level. The clock signal CK2 changes from low to high, while the NMOS transistors 47 and 48 are in the conducting state, thereby achieving faster nonconducting-to-conducting state transition of the MOS transistors mentioned above.

Subsequently, while the clock signal CK1 changes from high to low at time t=2 and the clock signal CK2 changes from high to low with a fixed delay with respect to the clock signal CK1 at time=2', the PMOS transistors 39 and 40 are switched to the conducting state again. At this time, however, the NMOS transistors 41 and 42 are switched to the nonconducting state, thereby blocking a current route from the power source (VDD) through the PMOS transistor 39 and the NMOS transistors 42, 44, and 48 to ground (GND). This completely blocks feedthrough current flowing from the power source (VDD) to ground (GND), thus making it possible to prevent an increase in power consumption.

At this time, since the current path of the NMOS transistor 42 is blocked, charge current for causing the potential of a node of the source of the NMOS transistor 42 and the drain of the NMOS transistor 44, and the potential of a node of the source of the NMOS transistor 44 and the drains of the NMOS transistor 46 and 48 to change from the ground (GND) potential to a potential near the power source (VDD) potential becomes unnecessary, making it possible to reduce the switching current. The current amount that can be reduced corresponds to the current amount that is needed to charge diffusion layer capacitance added to the drain and source terminals of the NMOS transistor 32 shown in FIG. 2 and metal wiring capacitance in the second embodiment.

The following are examples of practical power consumption of the prior-art input circuit shown in FIG. 6 and the input circuits according to the first to third embodiments of the present invention.

prior art input circuit (FIG. 6): 2.20 mW input circuit of the first embodiment (FIG. 1): 0.92 mW input circuit of the second embodiment (FIG. 2): 0.76 mW input circuit of the third embodiment (FIG. 3): 0.60 mW These examples assume that power source voltage (VDD)=2.0 V, ground voltage (GND)=0.0 V, bit rate of a data signal=1 Gbps, and clock frequency=1 GHZ. As described above, it can be understood that the input circuit of the present invention is effective to reduce a large amount of power consumption.

While embodiments of the present invention have been described, it is to be understood that the invention is not limited thereto but modifications may be made to those skilled in the art without departing from the scope and spirit of the invention in its broader aspects.

As described above, the present invention can reduce both feedthrough current and charge current induced when clock input changes from high to low, thus enabling faster operation while achieving substantially reduced power consumption.

Although the invention has been described with reference to specific embodiments, this description is not meant to be construed in a limiting sense. Various modifications of the disclosed embodiments will become apparent to persons skilled in the art upon reference to the description of the invention. It is therefore contemplated that the appended claims will cover any modifications or embodiments as fall within the true scope of the invention.

What is claimed is:

1. An input circuit comprising:
   a data input means for receiving input data of the input circuit;
   a data latch means for latching output data of the input circuit;
   a reset means for resetting the data latch means in response to a first logic level of a first clock signal;
   a latch enhancement means for enhancing a latching operation of the data latch means in response to a first logic level of a second clock signal that is delayed in a phase from the first clock signal; and
   a clock synchronization means for transferring the input data from outputs of the data input means to the data latch means in response to a second logic level of the first clock signal,
   the clock synchronization means blocking a feedthrough current that flows through the reset means, the data latch means, and the latch enhancement means when the first and second clock signals are in a state of said first logic level.

2. The input circuit of claim 1, wherein:
   the data input means comprises sources of both a first NMOS transistor and a second NMOS transistor being connected to a power source;
   a gate of the first NMOS transistor being connected to a first data input terminal;
   a gate of the second NMOS transistor being connected to a second data input terminal;
   a drain of the first NMOS transistor being connected to a common terminal at which one of a pair of complementary signals constituting the outputs of the input data means appears; and
   a drain of the second NMOS transistor being connected to a common terminal at which another one of the pair of complementary signals constituting the outputs of the input data means appears.

3. The input circuit of claim 1, wherein the clock synchronization means comprises gates of a first NMOS transistor and a second NMOS transistor being connected to a first clock input terminal; a source of the first NMOS transistor being connected to a first common terminal at which one of a pair of complementary signals constituting the outputs of the input data means appears; a source of the second NMOS transistor being connected to a second common terminal at which the other one of the pair of complementary signals constituting the outputs of the input data means appears; a drain of the first NMOS transistor being connected to a third common terminal; and a drain of the second NMOS transistor being connected to a fourth common terminal.

4. The input circuit of claim 1, wherein:
   the latch enhancement means comprises sources of both a first NMOS transistor and a second NMOS transistor being connected to a power source;
   gates of both the first NMOS transistor and the second NMOS transistor being connected to a clock input terminal;
   a drain of the first NMOS transistor being connected to a first common terminal at which one of a pair of complementary signals constituting the outputs of the data input means appears; and
   a drain of the second NMOS transistor being connected to a second common terminal at which another one of the pair of complementary signals constituting the outputs of the data input means appears.

5. An input circuit comprising:
   a data input means for receiving input data of the input circuit;
   a data latch means connected to the data input means and including an activating means for activating the data latch means and inputting the input data in response to a first logic level of a first clock signal;
   reset means for resetting the data latch means in response to a second logic level of the first clock signal; and
   a latch enhancement means for enhancing a latching operation of the data latch means in response to a first logic level of a second clock signal that is delayed in a phase from the first clock signal,
   wherein said activating means blocks a feedthrough current that flows through the reset means, the data latch means, and the latch enhancement means when the first clock signal is an a state of said second logic level and the second clock signal is in a state of said first logic level.

6. An input circuit comprising:
   a data input unit that receives input data of the input circuit;
   a data latch unit that latches output data of the input circuit;
   a reset unit that resets the data latch unit in response to a first logic level of a first clock signal;
   a latch enhancement unit that enhances a latching operation of the data latch unit in response to a first logic level of a second clock signal that is delayed in a phase from the first clock signal; and
   a clock synchronization unit that transfers the input data from outputs of the data input unit to the data latch unit in response to a second logic level of the first clock signal,
   the clock synchronization unit blocking a feedthrough current that flows through the reset unit, the data latch unit, and the latch enhancement unit when the first and second clock signals are in a state of said first logic level.

7. An input circuit comprising:
   a data input unit that receives input data of the input circuit;
   a data latch unit, connected to the data input unit, that latches output data of the input circuit, the data latch unit having an activating unit that activates the data latch unit and inputs the input data in response to a first logic level of a first clock signal;
   a reset unit that resets the data latch unit in response to a second logic level of the first clock signal;
   a latch enhancement unit that enhances a latching operation of the data latch unit in response to a first logic level of a second clock signal that is delayed in a phase from the first clock signal,
   wherein said activating unit blocks a feedthrough current that flows through the reset unit, the data latch unit, and the latch enhancement unit when the first clock signal is in a state of said second logic level and the second clock signal is in a state of said first logic level.

* * * * *